United States Patent
Adderly et al.

(10) Patent No.: US 9,543,219 B2
(45) Date of Patent: Jan. 10, 2017

(54) VOID MONITORING DEVICE FOR MEASUREMENT OF WAFER TEMPERATURE VARIATIONS

(71) Applicant: GLOBALFOUNDRIES INC., Grand Cayman (KY)

(72) Inventors: Shawn A. Adderly, Essex Junction, VT (US); Samantha D. DiStefano, Burlington, VT (US); Mark J. Esposito, Georgia, VT (US); Jeffrey P. Gambino, Westford, VT (US); Prakash Periasamy, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/557,819

(22) Filed: Dec. 2, 2014

(65) Prior Publication Data
US 2016/0155675 A1    Jun. 2, 2016

(51) Int. Cl.
*H01L 21/66*  (2006.01)
*H01L 21/768* (2006.01)
*H01L 23/528* (2006.01)

(52) U.S. Cl.
CPC .......... *H01L 22/10* (2013.01); *H01L 21/768* (2013.01); *H01L 23/528* (2013.01); *H01L 2924/0002* (2013.01)

(58) Field of Classification Search
None
See application file for complete search history.

(56) References Cited

U.S. PATENT DOCUMENTS

| 5,164,790 | A  | * | 11/1992 | McNeil ................. G01B 11/02 356/496 |
| 5,769,540 | A  |   | 6/1998  | Schietinger et al. |
| 6,033,922 | A  |   | 3/2000  | Rowland et al. |
| 6,383,824 | B1 | * | 5/2002  | Lensing ................ G01B 11/30 257/E21.528 |
| 6,562,635 | B1 | * | 5/2003  | Lensing ............ G01N 21/9501 438/7 |
| 6,604,853 | B2 |   | 8/2003  | Chao et al. |

(Continued)

FOREIGN PATENT DOCUMENTS

| WO | 03075322 A2    | 9/2003  |
| WO | 2012137013 A1  | 10/2012 |

OTHER PUBLICATIONS

Lee et al., "A Mechanism of Stress-induced Metal Void in narrow Aluminum-based Metallization with the HDP CVD oxide dielectric", U FAB Process, Semiconductor R&D Division, Samsung Electronics, Korea, 1999 IEEE, pp. IITC 99-149-IITC 99-151.

*Primary Examiner* — Hoang-Quan Ho
(74) *Attorney, Agent, or Firm* — Gibb & Riley, LLC; Anthony J. Canale

(57) ABSTRACT

A method of monitoring a temperature of a plurality of regions in a substrate during a deposition process, the monitoring of the temperature including: forming, in the monitored plurality of regions, a plurality of metal structures each with a different metal pattern density, where each metal pattern density corresponds to a threshold temperature at or above which metal voids and surface roughness are formed in the plurality of metal structures, and detecting metal voids and surface roughness in the plurality of metal structures to determine the temperature of the monitored plurality of regions.

17 Claims, 6 Drawing Sheets

(56) References Cited

U.S. PATENT DOCUMENTS

| | | | |
|---|---|---|---|
| 6,677,170 B1 * | 1/2004 | Markle | G01B 11/0625 |
| | | | 438/16 |
| 6,684,172 B1 * | 1/2004 | Subramanian | C23C 14/547 |
| | | | 257/E21.585 |
| 6,794,299 B1 * | 9/2004 | Markle | H01L 22/20 |
| | | | 257/E21.525 |
| 6,829,559 B2 | 12/2004 | Bultman et al. | |
| 6,875,622 B1 * | 4/2005 | Markle | G01N 21/47 |
| | | | 438/14 |
| 7,079,975 B1 * | 7/2006 | Halliyal | G01B 11/0625 |
| | | | 438/16 |
| 7,951,616 B2 | 5/2011 | Kanarik et al. | |
| 8,152,365 B2 | 4/2012 | Timans | |
| 8,162,538 B2 | 4/2012 | Mizuno et al. | |
| 8,426,856 B2 | 4/2013 | Ayotte et al. | |
| 8,668,383 B2 | 3/2014 | Timans | |
| 2001/0053600 A1 * | 12/2001 | Morales | H01L 21/28518 |
| | | | 438/627 |
| 2006/0051884 A1 * | 3/2006 | McNamara | G01N 25/18 |
| | | | 438/14 |
| 2009/0016407 A1 | 1/2009 | Mizuno et al. | |
| 2009/0250697 A1 * | 10/2009 | Enda | H01L 22/12 |
| | | | 257/48 |
| 2011/0315985 A1 * | 12/2011 | Oba | G01K 7/16 |
| | | | 257/48 |

\* cited by examiner

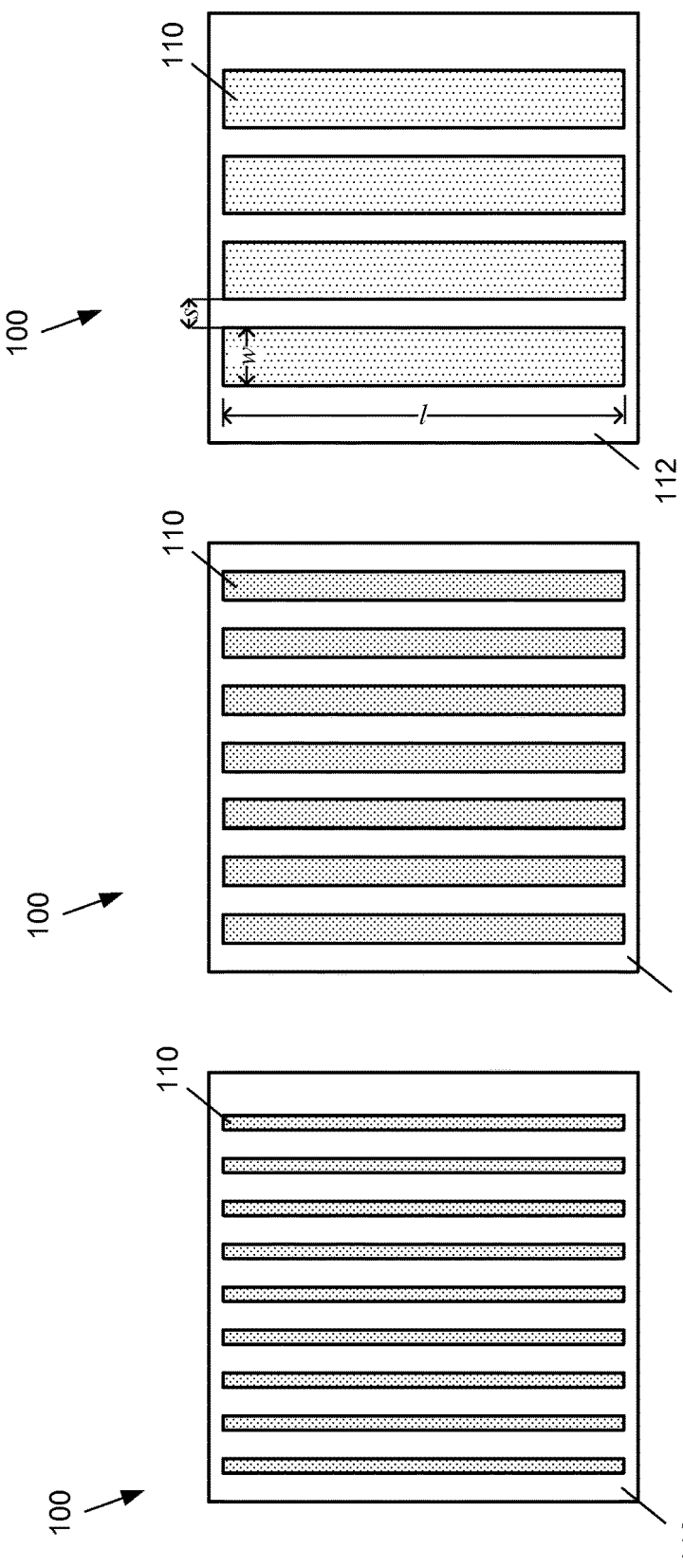

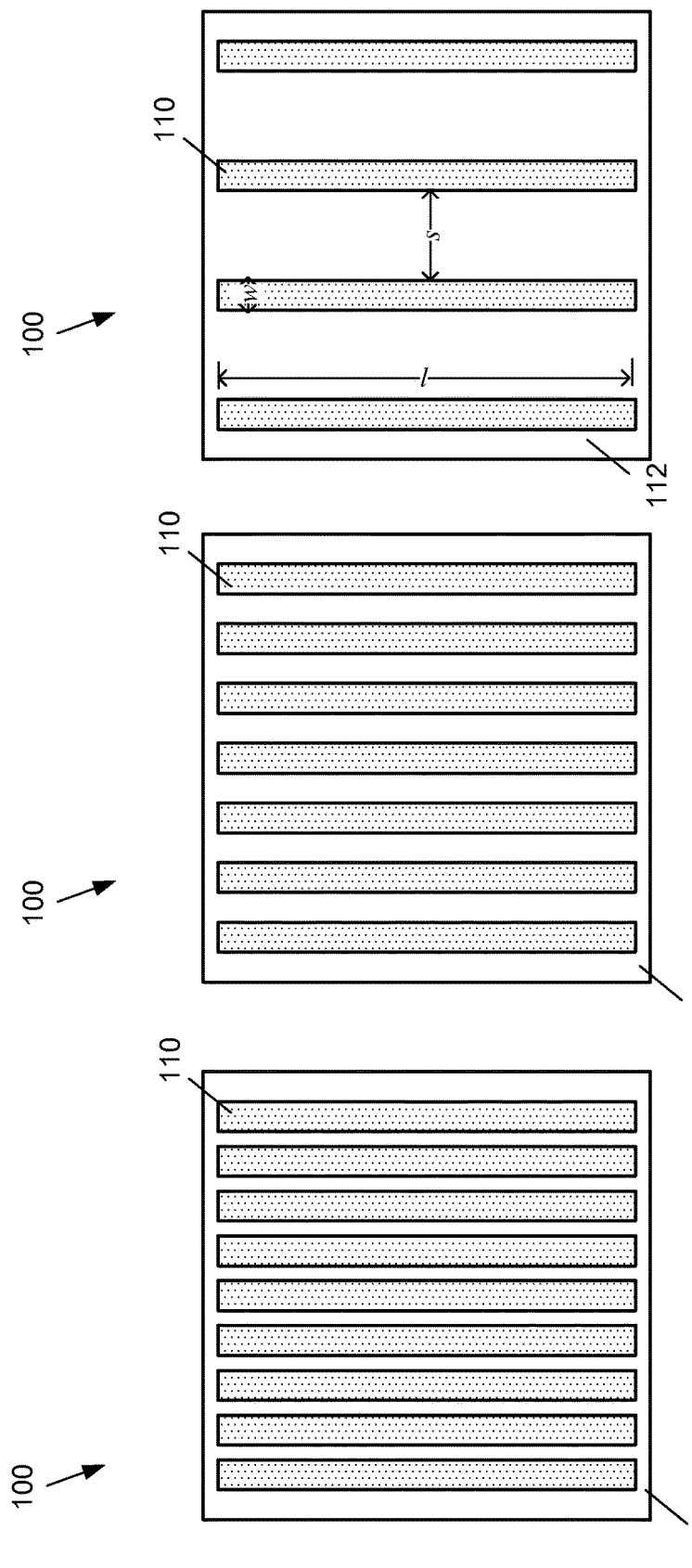

VOID MONITORING DEVICE FOR MEASUREMENT OF WAFER TEMPERATURE VARIATIONS

BACKGROUND

The present invention generally relates to semiconductor manufacturing, and more particularly to improving wafer temperature measurements during high density plasma (HDP) chemical vapor deposition (CVD) of dielectric films.

Microelectronic devices are generally fabricated on substrates such as, for example, silicon wafers, using a variety of processing methods including numerous deposition and removal techniques. During the semiconductor fabrication process, various layers of a conductor film and a dielectric film may be deposited on the substrate to form most of the electrical interconnects on a multilevel integrated-circuit chip. Generally, the dielectric film may include a silicon-based dielectric material such as silicon oxide, hydrogenated silicon carbon oxide, and other silicon-based low-k dielectrics. The conductor film may typically include an aluminum-based or a copper-based metal.

In submicron device manufacturing, a high density plasma (HDP) chemical vapor deposition (CVD) process may be conducted to form the dielectric film on the substrate. This type of plasma deposition process may generate large amounts of heat which may require careful temperature monitoring during processing of the substrate since a substantial temperature increase may cause significant damage to particularly aluminum-based electrical interconnects, negatively impacting product yield and reliability.

SUMMARY

According to an embodiment of the present invention, a method is provided. The method may include monitoring a temperature of a plurality of regions in a substrate during a deposition process, the monitoring of the temperature including: forming, in the monitored plurality of regions, a plurality of metal structures each with a different metal pattern density, where each metal pattern density corresponds to a threshold temperature at or above which metal voids and surface roughness are formed in the plurality of metal structures, and detecting metal voids and surface roughness in the plurality of metal structures to determine the temperature of the monitored plurality of regions.

According to another embodiment, a method is provided. The method may include forming at least one die on a substrate, the at least one die including an active area surrounded by a dicing channel, forming, on a region outside the active area, a metal structure with a metal configuration having a metal density, the metal density corresponding to a threshold temperature at or above which metal voids and surface roughness are formed in the metal structure, depositing a dielectric material on the substrate above and in direct contact with the metal structure, and detecting metal voids or surface roughness in the metal structure to determine a temperature of the substrate.

According to another embodiment, a structure is provided. The structure may include a substrate including at least one die having an active area, where the active area of the at least one die is surrounded by a dicing channel, a first metal structure on a region outside the active area of the at least one die, the first metal structure includes a first metal pattern density corresponding to a first threshold temperature at or above which metal voids and surface roughness exist in the first metal structure, where the region outside the active area includes a chamfered corner outside the active area of the at least one die or the dicing channel, and a dielectric material on the substrate above and in direct contact with the first metal structure.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

FIGS. 1-3 illustrate top-down views of a plurality of void monitoring devices depicting possible configurations of metal wires, according to an embodiment of the present disclosure;

FIGS. 4-6 illustrate top-down views of the plurality of void monitoring devices depicting an alternate configuration of the metal wires, according to an embodiment of the present disclosure;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 9:
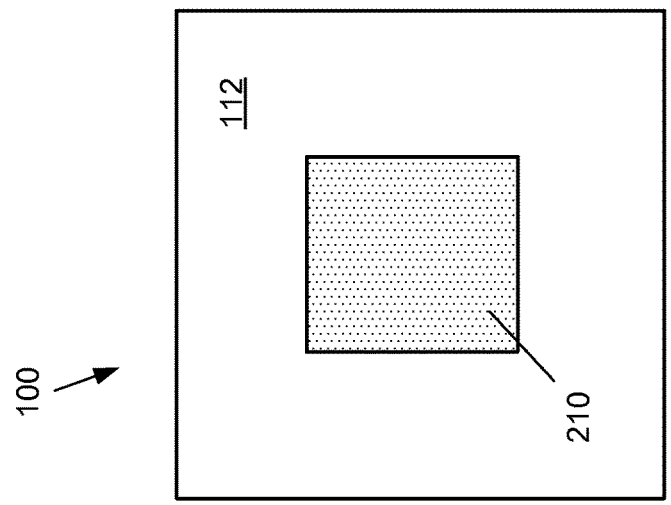
FIGS. 7-9 illustrate top-down views of the plurality of void monitoring devices depicting possible configurations of metal regions, according to an embodiment of the present disclosure.

Detailed embodiments of the claimed structures and methods are disclosed herein; however, it may be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it may be directly on the other element or intervening elements may also be present. In contrast, when an element is referred to as being "directly on" or "directly over" another element, there are no intervening elements present. It will also be understood that when an element is referred to as being "beneath," "below," or "under" another element, it may be directly beneath or under the other element, or intervening elements may be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

High temperatures (above 370° C. to 400° C.) during high density plasma (HDP) chemical vapor deposition (CVD) processing may promote diffusion and increase tensile stress in a substrate. This stress may be induced by a mismatch in the coefficient of thermal expansion (CTE) between a metal-based conductor film (e.g. aluminum or copper) and a neighboring dielectric film which may accelerate the formation of metal voids. Typically, the formation of metal voids may be prompted by an overshoot of deposition temperature during HDP CVD of a dielectric film. For example, at a HDP CVD temperature of approximately 550° C., aluminum-based metal interconnects may actually start to melt. This overshoot of deposition temperature may occur due to the dynamic processes involved in plasma systems including HDP CVD chambers. Typical HDP CVD chambers may extrapolate wafer temperature, for example surface temperature, from a single point through emissivity measurements which may be very sensitive to the type of substrate and other characteristics of the process wafer. Doing so may provide inaccurate temperature measurements during processing resulting in the unnecessary overshoot in deposition temperature which may lead to the formation of metal voids. Also, traditional temperature monitoring schemes, such as thermocouples and conventional or advanced pyrometry, may not be viable in such extreme environments (plasma and high temperatures).

Since the formation of metal voids may depend on several other factors, including, for example, geometry (diffusion length) and defect density, these factors may be manipulated to design a plurality of monitoring devices, monitoring structures, or test structures in which metal voids may be formed at or above a specific predetermined threshold temperature. By doing so, the temperature and/or temperature profile of the substrate subjected to HDP CVD processing may be more accurately measured and better controlled thereby reducing the formation of metal voids and enhancing uniformity of the deposited dielectric film.

Therefore, by forming a plurality of void monitoring devices each having a specified range of voiding threshold temperatures at single or multiple test sites in a substrate, embodiments of the present disclosure may, among other potential benefits, determine the temperature of one or more regions of the substrate or a temperature profile across the entire area of the substrate utilizing materials and processes already used in semiconductor fabrication thus improving product yield and reliability while potentially reducing manufacturing costs.

The present invention generally relates to semiconductor manufacturing, and more particularly to improving wafer temperature measurements during high density plasma (HDP) chemical vapor deposition (CVD) of dielectric films. One way to improve wafer temperature measurements during HDP CVD processes may include forming a plurality of void monitoring devices in one or multiple regions within the substrate. One embodiment by which to form the plurality of void monitoring devices is described in detail below by referring to the accompanying drawings in FIG. 1-16.

Referring now to FIGS. 1-3, a plurality of metal structures or void monitoring devices 100 (hereinafter "void monitoring devices") may be formed on a dielectric layer 112 of a substrate (not shown), according to an embodiment of the present disclosure. The dielectric layer 112 may include a silicon-based dielectric material such as silicon oxide, hydrogenated silicon carbon oxide, and other silicon-based low-k dielectrics. The dielectric layer 112 may be formed on the substrate (not shown) by chemical vapor deposition (CVD) of the silicon-based dielectric material. Each of the void monitoring devices 100 may include a plurality of metal wires 110 (hereinafter "metal wires") formed on a top surface of the dielectric layer 112. Each metal wire 110 may be substantially parallel to an adjacent metal wire 110. The metal wires 110 may include, for example, aluminum (Al) or copper (Cu).

In embodiments in which the metal wires 110 include aluminum, the metal wires 110 may be formed using a subtractive etch process including: depositing a metal stack (for example, Ti/Al alloy/TiN) on the underlying dielectric layer 112 using sputter deposition, forming a resist pattern to define the metal wires 110, etching the metal wires 110 using reactive ion etching (RIE), then strip the resist using an oxygen plasma. The metal wires 110 may then be covered with a dielectric material, typically silicon oxide ($SiO_2$), subsequently deposited by HDP CVD or plasma enhanced CVD as will be described in detail below.

In embodiments in which the metal wires 110 include copper, the metal wires 110 may be formed using a damascene process including: depositing a dielectric material, forming a resist pattern to define trenches, etching the trenches using RIE, filling the trenches with a metal (i.e. TaN/Ta/Cu), then removing the excess metal using chemical mechanical polishing (CMP). The metal wires 110 may then be covered with a dielectric material, typically silicon nitride (SiN) or silicon carbon nitride (SiCN), subsequently deposited by HDP CVD or plasma enhanced CVD as will be described in detail below.

In the present embodiment, the metal wires 110 may have a length/varying between approximately 5 μm to approximately 100 μm. The metal wires 110 may have a width w of approximately 0.2 μm to approximately 3 μm.

It should be noted that the void monitoring devices 100 may be formed as part of the typical process of forming aluminum or copper wires in a substrate, and coating with a dielectric material. However, the layout may be optimized to maximize void formation or surface roughness (hillocks) in the metal when the temperature exceeds a specified value. The void monitoring devices 100 may be located across an area of the substrate as will be explain in detail below.

The different configurations of metal wires 110 in each of the void monitoring devices 100 depicted in FIGS. 1-3 may provide void monitoring devices 100 exhibiting different threshold temperatures at or above which metal voids or hillocks may be formed. More specifically, a temperature sensitivity of each of the void monitoring devices 100 may be proportional to a width w of the metal wires 110. In this embodiment, each of the void monitoring devices 100 may include metal wires 110 of different widths. For example, narrower metal wires 110 may be formed in the void monitoring device 100 depicted in FIG. 1 while wider metal wires 110 may be formed in the void monitoring device 100 depicted in FIG. 2 and in the void monitoring device 100 depicted in FIG. 3. The void monitoring device 100 depicted in FIG. 1 (narrowest metal wires) may be more sensitive to a temperature increase due to the higher density of metal wires 110 which may provide a larger area for heat transfer, this may in turn facilitate the formation of metal voids at lower temperatures during plasma-based deposition processes. Conversely, the void monitoring device 100 depicted in FIG. 3 (widest metal wires) may be less sensitive to temperature variations in the substrate thereby forming metal voids at higher deposition temperatures.

It should be noted that narrow metal wires may be more sensitive to void formation whereas wide metal wires may be more sensitive to hillock formation. Hence, an excessive temperature during a subsequent dielectric deposition process may be detected as voids in narrow metal wires or as surface roughness (hillocks) in wide metal wires. Additionally, electrical coupling between the metal wires 110 and the deposition plasma may increase with increasing metal density. Therefore, metal wires with a high metal density may be more sensitive to temperature changes than metal wires with a low metal density. Because numerous factors may affect void formation and roughness in the metal wires 110, a variety of metal wire layouts or patterns may be used in the void monitoring devices 100 in order to maximize the range of temperatures for which the void monitoring devices 100 will be used to detect the sensitivity to temperature across the substrate.

Different configurations or layouts of metal wires 110 may be considered in order to increase or decrease the metal density in each of the void monitoring devices 100 such that the accuracy of temperature measurements across a substrate during high temperature deposition of dielectric materials may be tuned or calibrated.

In this embodiment, by increasing the width w of the metal wires 110 as depicted in the figures, void monitoring devices 100 exhibiting different threshold temperatures for metal voids (or roughness) formation may be placed across a substrate (not shown) to monitor temperature changes during HDP CVD of dielectric materials, as will be described in detail below. Metal voids or hillocks may form in the metal wires 110 at or above a threshold temperature that may correspond to the metal density of each of the void monitoring devices 100. More specifically, the threshold temperature of each void monitoring device 100 may be inversely proportional to their metal density.

It should be noted that in the embodiment described with reference to FIGS. 1-3, a spacing s between metal wires 110 may remain the same. The spacing s between metal wires 110 may vary between approximately 0.1 μm to approximately 10 μm. In these embodiment, only the width w of the metal wires 110 may vary in order to provide different voiding threshold temperatures.

Referring now to FIGS. 4-6, void monitoring devices 100 including alternate metal wire configurations are shown, according to an embodiment of the present disclosure. In this embodiment, the width w of the metal wires 110 may remain constant, while the spacing s between each metal wire 110 may change in the void monitoring devices 100 as depicted in the figures. For example, in the void monitoring device 100 depicted in FIG. 4, the spacing s between each metal wire 110 may vary between approximately 0.1 μm to approximately 0.5 μm while in the void monitoring device 100 depicted in FIG. 5 may vary between approximately 0.5 μm to approximately 1 μm. The largest spacing between metal wires 110 may be observed in the void monitoring device 100 depicted in FIG. 6, in this case the spacing s between each metal wire 110 may vary between approximately 1 μm to approximately 10 μm.

In this embodiment, the different spacing arrangements in the void monitoring devices 100 may be correlated to temperature changes during a deposition process since less space between metal wires 110 may allow for a higher wire or metal density per void monitoring device 100 which corresponds to a lower threshold temperature for void formation that in turn may increase sensitivity to temperature changes in the void monitoring device 100 as described above. For example, the void monitoring device 100 depicted in FIG. 4 (smallest spacing) may be more sensitivity to temperature changes during HDP CVD, thus forming metal voids at lower deposition temperatures. Conversely, the void monitoring device 100 depicted in FIG. 6 (largest spacing) may provide a monitoring device with lower sensitivity to temperature changes due to the lower density of metal wires 110 per device area, in this case formation of metal voids may occur at substantially higher temperatures.

The different metal wires configurations depicted in FIGS. 1-6 may provide void monitoring devices covering a substantially wide range of voiding threshold temperatures which may in turn tune or calibrate the accuracy of temperature measurements across a substrate during high temperature deposition processes of dielectric materials, such as HDP CVD.

Figure 8:
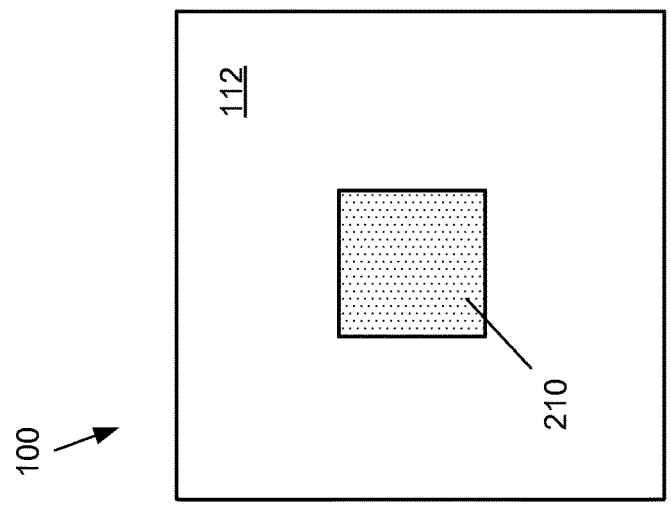
Figure 7:
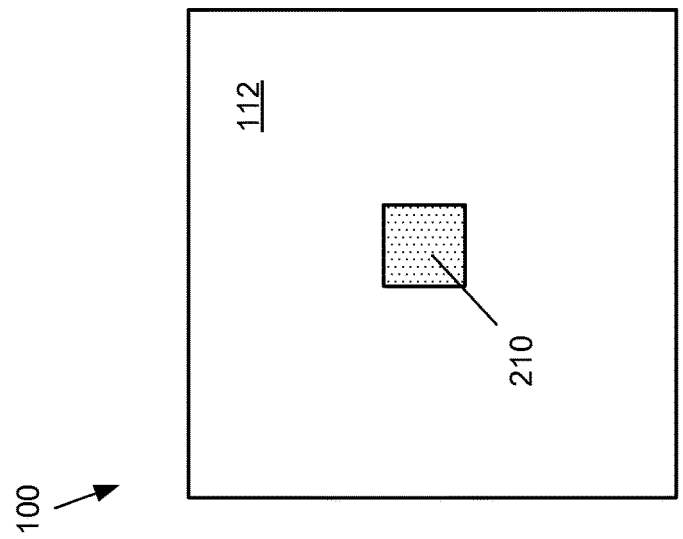

Referring now to FIGS. 7-9, an alternate metal pattern in the void monitoring devices 100 is shown, according to an embodiment of the present disclosure. In this embodiment, a plurality of metal regions 210 (hereinafter "metal regions") may be formed on the dielectric layer 112. The metal regions 210 may include similar materials and may be formed in a similar fashion as the metal wires 110 described above with reference to FIGS. 1-3. The metal regions 210 may be located at the center of each void monitoring device 100 as depicted in the figures. In this embodiment, metal regions 210 of different sizes may be formed in different void monitoring devices 100 in order to provide a wider range of voiding threshold temperatures during HDP CVD processes. For example, the void monitoring device 100 depicted in FIG. 7 may include a relatively small metal region 210, while the void monitoring devices 100 depicted in FIGS. 8 and 9, respectively, may have larger metal regions 210. The difference in size of the metal regions 210 may be correlated to a different voiding threshold temperature which may increase or decrease the sensitivity of each void monitoring device 100 to temperature variations during deposition of dielectric materials on substrates. For example, the void monitoring device 100 with the smallest metal region 210 (FIG. 7) may be less sensitive to temperature variations and may form voids at higher deposition temperatures than the void monitoring device 100 with the largest metal region 210 (FIG. 9). A larger metal region 210 may provide a bigger surface area for heat transfer thus forming void monitoring devices 100 substantially sensitive to variations in deposition temperatures.

Figure 10:
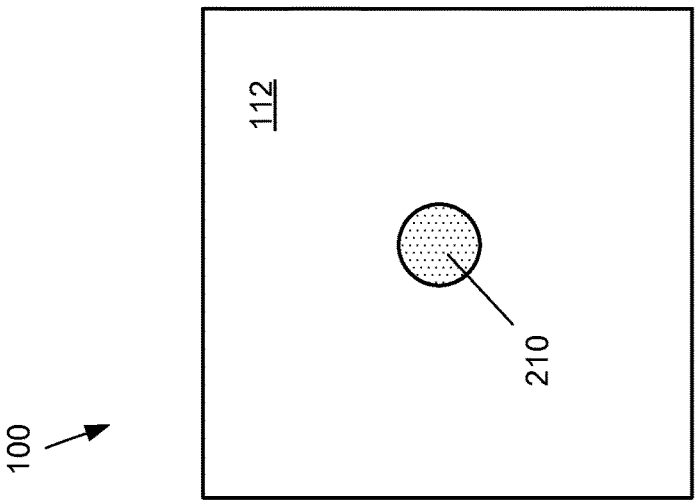
FIGS. 10-12 illustrate top-down views of the plurality of void monitoring devices depicting an alternate configuration of the metal regions, according to an embodiment of the present disclosure.
Figure 11:
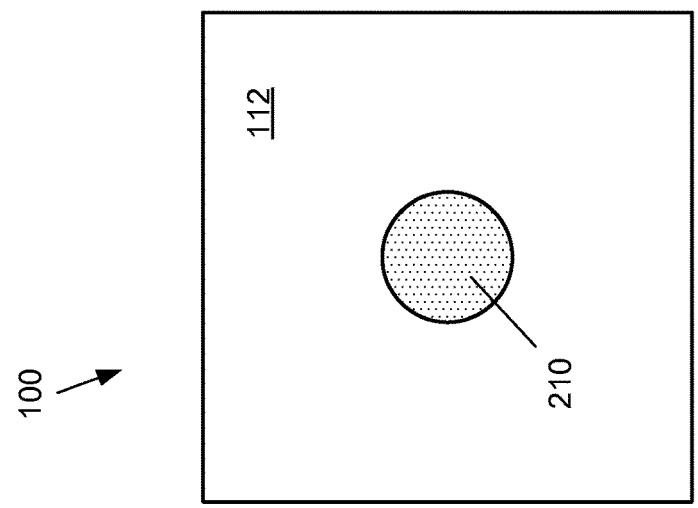
Figure 12:
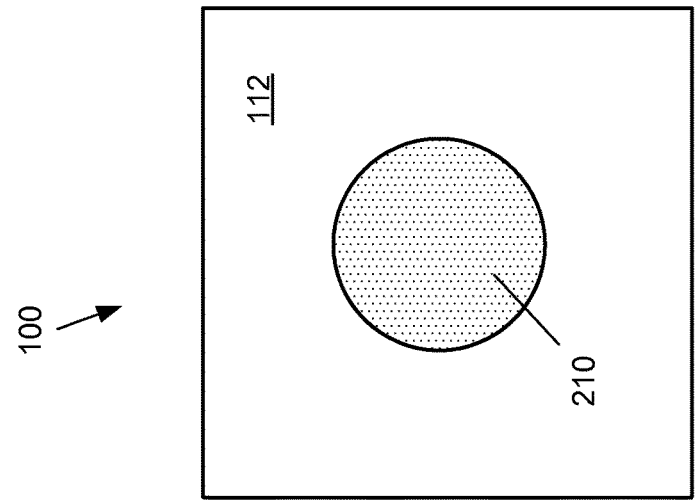

In this embodiment, the metal regions 210 may include a squared shape, however other geometric shapes may also be considered. For example, the metal regions 210 may include a circular shape as illustrated in FIGS. 10-12. It should be noted that due to the differences in overall surface area and hence in metal densities, some geometric shapes may form void monitoring devices with higher or lower sensitivity to temperature changes than others.

Larger metal regions 210 may be more sensitive to void formation whereas small metal regions 210 may be more sensitive to surface roughness (hillock) formation. Hence, excessive temperature during a subsequent dielectric deposition may be detected as metal voids in the large metal regions (higher metal density) or as surface roughness in the small metal regions (lower metal density). Also, electrical coupling between the metal regions 210 and the deposition plasma may increase with increasing metal density. Therefore, metal regions with high metal density may be more sensitive to temperature than metal regions with low metal density, as described above. In general, because numerous factors may affect void formation and roughness in the metal regions 210, a variety of metal region layouts may be used in the void monitoring devices 100 in order to maximize the range of temperature measurements for which the void monitoring devices 100 will be used to detect the sensitivity to temperature during high temperature deposition processes.

Figure 15:
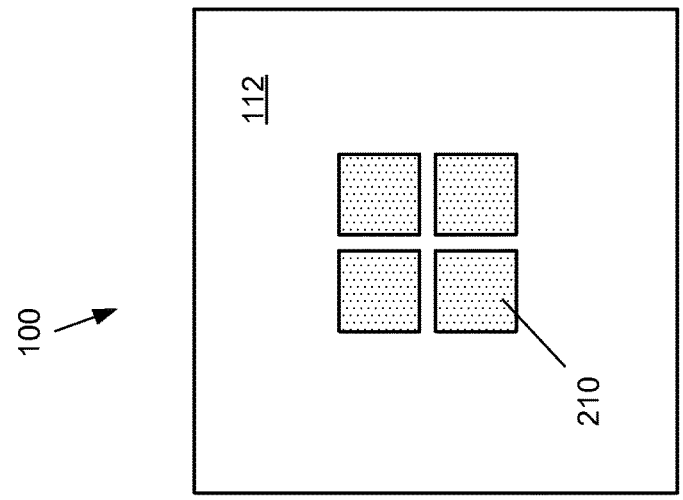
FIGS. 13-15 illustrate top-down views of the plurality of void monitoring devices depicting another alternate configuration of the metal regions, according to an embodiment of the present disclosure.
Figure 14:
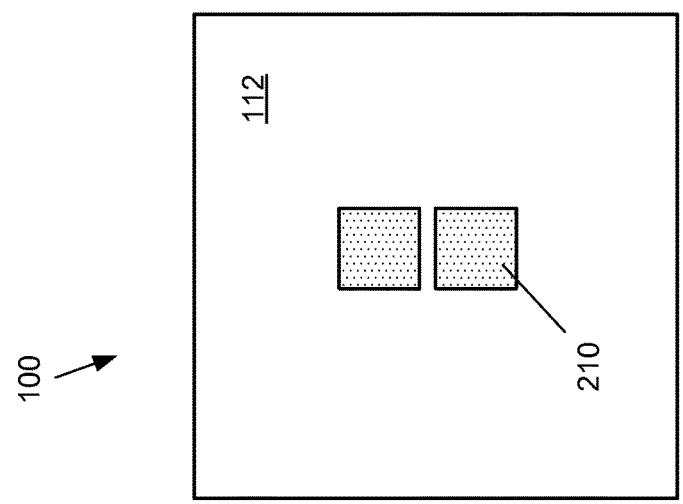
Figure 13:
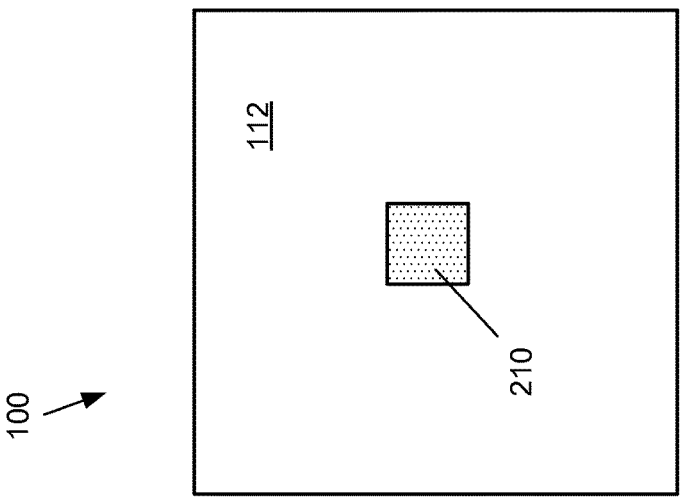

Referring now to FIGS. 13-15, alternate configurations or layouts of metal regions 210 in the void monitoring devices 100 are shown, according to an embodiment of the present disclosure. In this embodiment, numerous metal regions 210 may be formed on the dielectric layer 112 as depicted in FIGS. 14-15 in order to increase the metal density and hence the sensitivity to temperature variations in the void monitoring devices 100. The void monitoring device 100 depicted in FIG. 1 may include one metal region 210, consequently it may have a lower metal density corresponding to a higher threshold temperature for void formation which may decrease its sensitivity to temperature variations. The opposite may occur in the void monitoring devices 100 depicted in FIGS. 14 and 15 in which two or more metal regions 210 have been formed corresponding to an increased metal density in each device which translates into a lower voiding threshold temperature and higher sensitivity to temperature changes. The void monitoring device 100 depicted in FIG. 5 including the largest number of metal regions 210 may have the highest sensitivity to temperature variations due to a higher metal density per device area, as previously described.

For illustration purposes only, without intent of limitation, the maximum number of metal regions 210 in the void monitoring devices 100 is depicted as four metal regions 210. It should be noted that any number of metal regions 210 may be formed in the dielectric layer 112 such that the void monitoring devices 100 may provide a wider spectrum of voiding threshold temperatures in order to accurately measure and control temperature variations in substrates during HDP CVD of dielectric films.

In this embodiment, the metal regions 210 include a squared shape, however other geometric shapes may also be considered.

Figure 16:
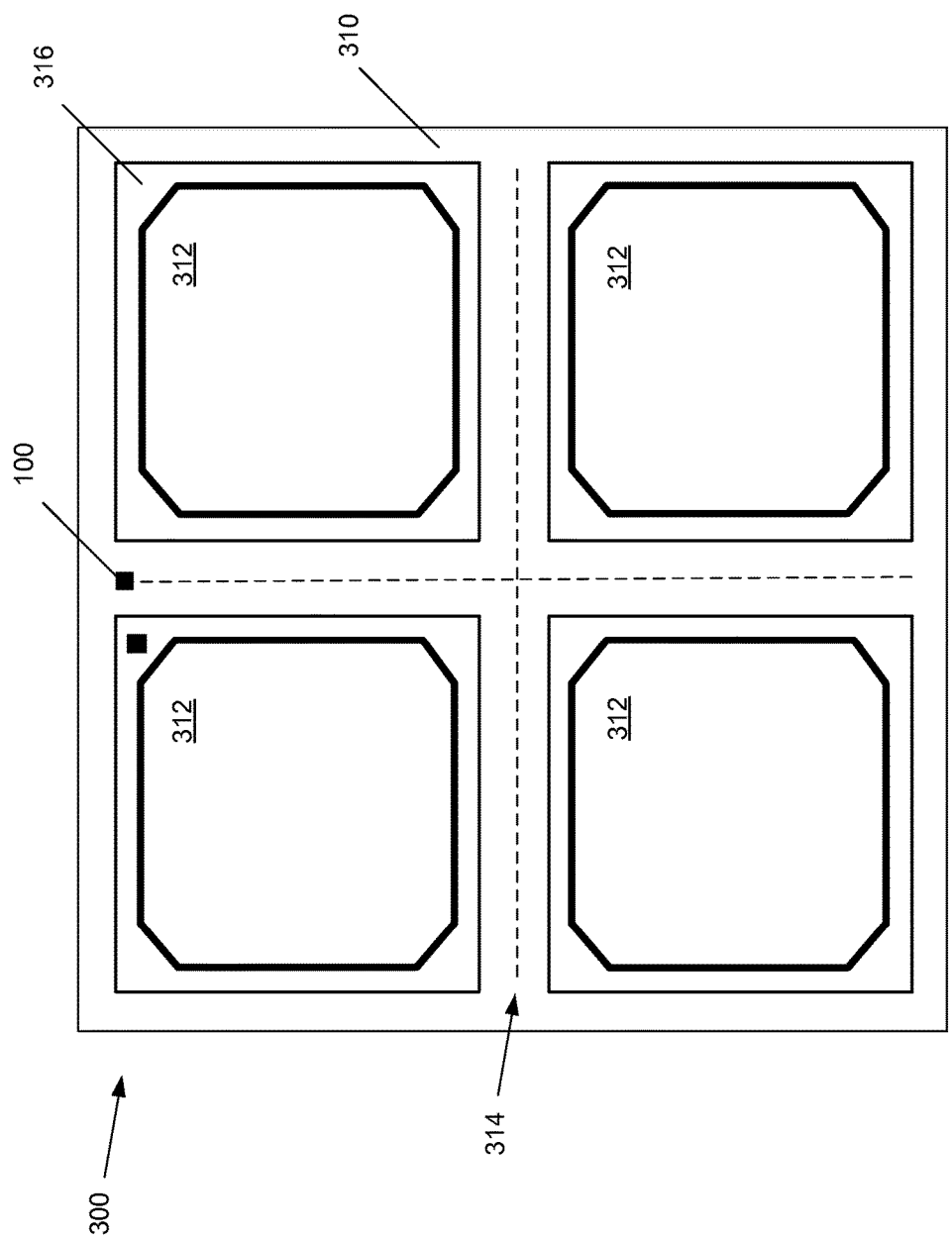
FIG. 16 illustrates a top-down view of a semiconductor structure depicting forming the plurality of void monitoring devices in a substrate for temperature monitoring and measurement, according to an embodiment of the present disclosure.

Referring now to FIG. 16, an exemplary embodiment depicting the location of the void monitoring devices 100 in a semiconductor structure 300 for temperature monitoring and measurement during a deposition process is shown, according to an embodiment of the present disclosure. The semiconductor structure 300 may include, for example, a semiconductor chip. The semiconductor structure 300 may be formed on a substrate 310. The substrate 310 may include, for example, any known semiconductor material, glass, or sapphire. In one embodiment, the substrate 310 may include a silicon wafer. The semiconductor structure 300 may include a plurality of active areas 312 (hereinafter "active areas") within the substrate 310, each of the active areas 312 may be located on a portion of the substrate 310 forming semiconductor dies 316. The semiconductor dies 316 may also be referred to as "dies". Each semiconductor die 316 may be separated from an adjacent semiconductor die 316 by a dicing channel 314. Stated differently, each semiconductor die 316 may be surrounded by the dicing channel 314. The dicing channel 314 is the area between semiconductor dies 316 depicted by dotted lines in the figure. It should be noted that the dicing channel 314 may be typically referred to as a kerf area.

The void monitoring devices 100 may be formed on any area of the substrate 310 outside the active areas 312. In some embodiments, one or more of the void monitoring devices 100 may be located outside a chamfered corner of the active areas 312 while one or more of the void monitoring devices 100 may be located in the dicing channel 314. By locating the void monitoring devices 100 outside the chamfered corner of the active areas 312, damage during dicing of the semiconductor structure 300 caused by the presence of metals in the dicing channel 314 may be reduced. According to an embodiment, the void monitoring devices 100 may be located in portions of the substrate 310 outside the active areas 312 of each semiconductor die 316 but not in the dicing channel 314. It may be understood that the void monitoring devices 100 may include any of the configurations described above with reference to FIGS. 1-15. For illustration purposes only, without intent of limitation, only two void monitoring devices 100 are depicted in the figure. It should be noted that any number of void monitoring devices 100 may be formed in the semiconductor structure 300 such that a wider spectrum of voiding threshold temperatures may exist in order to accurately measure and control temperature variations in substrate s during HDP CVD of dielectric films.

After forming the void monitoring devices 100 in the semiconductor structure 300, HDP CVD of a dielectric material or film (not shown) may be conducted. The dielectric material may be in contact with the void monitoring devices 100. Once the dielectric material has been deposited, an inspection of the semiconductor structure 300 may be performed in order to detect the presence of metal voids in the substrate 310. The presence of metal voids in the substrate 310 may be detected by, for example, optical scan of the semiconductor structure 300. In one embodiment, an optical microscope or scanning electron microscope inspection may be conducted after deposition of the dielectric material. In another embodiment, an in-situ inspection during the deposition process may be conducted using a laser tool to measure reflectance since roughness or voiding in the test structure may result in lower reflectance of the metal wires or regions.

Therefore by forming on a substrate a plurality of void monitoring devices having different voiding threshold temperatures, accurate measurement of the substrate temperature may be performed during high temperature deposition processes of a dielectric material. The different configurations of the void monitoring devices described above may provide a variety of voiding threshold temperatures that may help calibrating the void monitoring devices in order to facilitate monitoring and measurement of the semiconductor temperature as well as thermal budget control during HDP CVD of dielectric materials, this may in turn help reducing the formation of metal voids, improving uniformity of the deposited dielectric material, and enhancing product yield and reliability while reducing manufacturing costs.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
    providing a substrate with a plurality of regions and, in the plurality of regions, a plurality of metal structures, the metal structures having different patterns of metal with different metal pattern densities corresponding to different threshold temperatures at or above which development of metal voids and surface roughness occurs; and
    monitoring a temperature of the substrate during a deposition process to deposit a film on the substrate, the monitoring of the temperature comprising:
        inspecting the substrate to detect metal voids or surface roughness in any of the metal structures of the plurality of metal structures; and
        determining the temperature of the substrate based on each specific threshold temperature corresponding to each specific metal pattern density of each specific metal structure having the metal voids or the surface roughness detected therein.

2. The method of claim 1, wherein the plurality of regions are areas of the substrate outside an active region of a die including a chamfered corner outside the active region or a dicing channel.

3. The method of claim 1, wherein each metal pattern density comprises parallel metal wires of different widths and similar spacing between the parallel metal wires.

4. The method of claim 1, wherein each metal pattern density comprises parallel metal wires of similar widths and different spacing between the parallel metal wires.

5. The method of claim 1, wherein each metal pattern density comprises metal regions of different sizes and a similar geometric shape.

6. The method of claim 1, wherein each metal pattern density comprises one or more metal regions of similar geometric shape and spacing.

7. The method of claim 1, wherein the different threshold temperatures are inversely proportional to the different metal pattern densities.

8. The method of claim 1, wherein the inspecting comprises:
    conducting an optical microscope or scanning electron microscope inspection of the plurality of metal structures after the deposition process.

9. The method of claim 1, wherein the inspecting comprises:
    conducting an in-situ inspection of the plurality of metal structures during the deposition process using a laser tool that measures reflectance of the plurality of metal structures.

10. A method comprising:
    forming at least one die on a substrate, the at least one die comprising an active area surrounded by a dicing channel;
    forming, on a region outside the active area, at least one metal structure with a metal configuration having a metal density, the metal density corresponding to a threshold temperature at or above which development of metal voids and surface roughness occurs;
    depositing a dielectric material on the substrate above and in direct contact with the metal structure; and
    inspecting the metal structure to determine if metal voids or surface roughness occurred in the metal structure during the depositing and, based on results of the inspecting, determining a temperature of the substrate during the depositing, wherein detection of the metal voids or the surface roughness during the inspecting indicates that the temperature of the substrate was at or above the threshold temperature during the depositing and wherein lack of detection of the metal voids or the surface roughness during the inspecting indicates that the temperature of the substrate was below the threshold temperature during the depositing.

11. The method of claim 10, wherein the metal configuration comprises parallel metal wires of different widths and similar spacing between the parallel metal wires.

12. The method of claim 10, wherein the metal configuration comprises parallel metal wires of similar widths and different spacing between the parallel metal wires.

13. The method of claim 10, wherein the metal configuration comprises metal regions of different sizes and a similar geometric shape.

14. The method of claim 10, wherein the metal configuration comprises one or more metal regions of similar geometric shapes and spacing.

15. The method of claim 10, wherein the threshold temperature is inversely proportional to the metal density.

16. The method of claim 10, wherein the inspecting comprises:
    conducting an optical microscope or scanning electron microscope inspection of the metal structure after depositing the dielectric material.

17. The method of claim 10, wherein the inspecting comprises:
    conducting an in-situ inspection of the metal structure during depositing of the dielectric material using a laser tool that measures reflectance of the metal structure.

* * * * *